United States Patent
Abbiate et al.

(10) Patent No.: US 6,522,269 B2
(45) Date of Patent: Feb. 18, 2003

(54) SYSTEM AND METHOD FOR A SELF-DELINEATING SERIAL LINK FOR VERY HIGH-SPEED DATA COMMUNICATION INTERFACES

(75) Inventors: Jean-Claude Abbiate, La Gaude (FR); Alain Blanc, Tourrettes-sur-Loup (FR); Francois Le Maut, Nice (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/938,082

(22) Filed: Aug. 23, 2001

(65) Prior Publication Data

US 2002/0024455 A1 Feb. 28, 2002

(30) Foreign Application Priority Data

Aug. 29, 2000 (EP) .............................................. 00480082

(51) Int. Cl.[7] .................................................. H03M 5/20
(52) U.S. Cl. ............................................. 341/57; 341/56
(58) Field of Search ...................................... 341/56, 57

(56) References Cited

U.S. PATENT DOCUMENTS 4,897,854 A * 1/1990 Harris et al. .................. 341/57
4,910,750 A * 3/1990 Fisher .......................... 341/57

* cited by examiner

Primary Examiner—Howard L. Williams
(74) Attorney, Agent, or Firm—Bracewell & Patterson, LLP

(57) ABSTRACT

The system and method encodes a binary sequence of data bits into a sequence of ternary symbols and transmits the sequence of ternary symbols over a communication link. The encoding is performed so that no two consecutive symbols of the sequence are alike. The system and method assume that, for encoding, the previously encoded non-null symbol and the previously encoded symbol must be stored in a memory system. The sequence of symbols is transmitted in lieu of the binary sequence of data bits and decoded by a receiving device in order to restore the binary sequence of data bits from the received sequence of symbols. The decoding procedure assumes that three symbols must be received before a bit can be recovered. Hence, the system and method allow a self-delineation or self-sampling of a very-high speed data communication interface that is insensitive to large timing variations and skews.

20 Claims, 6 Drawing Sheets

Prior Art

SYSTEM AND METHOD FOR A SELF-DELINEATING SERIAL LINK FOR VERY HIGH-SPEED DATA COMMUNICATION INTERFACES

BACKGROUND OF THE INVENTION

1. Technical Field

The present invention relates generally to data communication interfaces and is particularly applicable to the very high-speed links required for interfacing communications components used to implement switching nodes of high-performance communications networks.

2. Description of the Related Art

In recent years, the explosive demand for bandwidth over communications networks has resulted in the development of very high-speed switching fabric devices. The availability of such devices has allowed the practical implementation of network switching nodes capable of handling aggregate data traffic in the range of hundreds of gigabits per second and, in the near future, in terabits per second. N×N switches can be viewed as black boxes, with N input ports and N output ports, aimed at moving data simultaneously from any incoming port to any outgoing port and to which very high-speed inter-node communication lines, forming a network, are indirectly attached through a line adapter. An example of a communication line is an OC-192 line, which corresponds to the level 192 of the Synchronous Optical Network (SONET) US hierarchy, equivalent to the European 64th level of the Synchronous Digital Hierarchy (SDH) and called STM-64, operating at a speed of 10 gigabits/s. A switching fabric is commonly a 16×16 or 32×32 switch, with 16 or 32 fully bi-directional ports matching the operational speed. Hence, building a switch tends to produce a large number of I/O connections since there are a large number of ports. Then, if these ports are made of parallel connections, this creates a very large number of wires to be handled through connectors on the backplane to and from the components of the switch fabric, forcing engineers to use costly board, module, and packaging solutions.

Hence, a preferred alternative is to limit the number of such connections per port while increasing their speed to the upper value compatible with the technologies in use, to reach the required bandwidth. However, as basic toggling speed increases, signal skew, when a signal on some paths arrives at a different time from a parallel a signal on a different path, becomes a limiting factor. Skew is a very serious limitation to effective use of parallel connections and control of skew is a key design issue.

Even though a link can be reduced, as shown in FIG. 1, to a single data connection 100, the problem of sampling received data signal 120 still needs to be solved. Although transmitter 130 and receiver 140 have the luxury of utilizing a sampling clock derived from the same source, this might not prove to be sufficient when the toggling speed is measured in gigabits/s when using the most current chip technologies like CMOS (Complementary Metal Oxide Semiconductors).

Indeed, accumulated jitter 165 introduced by transmitter 130 and receiver 140 appears to be often bigger than bit period 160 of the transmitted signal (so there is no safe window 170 left to sample the transmitted signal) or is becoming so marginal that a high error rate would be encountered if it were not properly handled. Obviously, the situation is potentially worse if the receiving device did not have available a clock derived from a common source. In which case, expensive and complex circuitry would be needed on every link in an attempt to recover a clock from the transmitted signal. This alternate method would also need to compensate for timing variations and changes of environmental conditions.

SUMMARY OF THE INVENTION

Accordingly, it is an object of the present invention to permit a self-delineation or self-sampling of a data communication interface so that it becomes insensitive to large timing variations.

It is another object of the present invention to provide a ternary code that allows the transmission of sequences of symbols in which consecutive symbols are always different.

It is yet another object of the present invention to provide a signal having transitions at each bit boundary.

A system and method for transmitting a binary sequence of data bits over a communication link are disclosed. The invention assumes that a ternary set of symbols are first define. They include a null symbol and two non-null symbols. Then, the binary sequence of data bits is encoded into a sequence of symbols, picked out from the ternary set of symbols, in such a way that no two consecutive symbols in the sequence are alike. The present invention assumes that, for encoding, the previously encoded non-null symbol and the previously encoded symbol must be stored in a memory system. The sequence of symbols is transmitted in lieu of the binary sequence of data bits. A decoding method and system are also disclosed in order to restore the binary sequence of data bits out of a received sequence of symbols. Decoding assumes that three symbols must be received to start recovering a bit. Also disclosed, are methods and systems for marking and detecting the sequence of symbols with breaks. The invention allows a self-delineation or self-sampling of a very-high speed data communication interface that is insensitive to large timing variations and skews.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
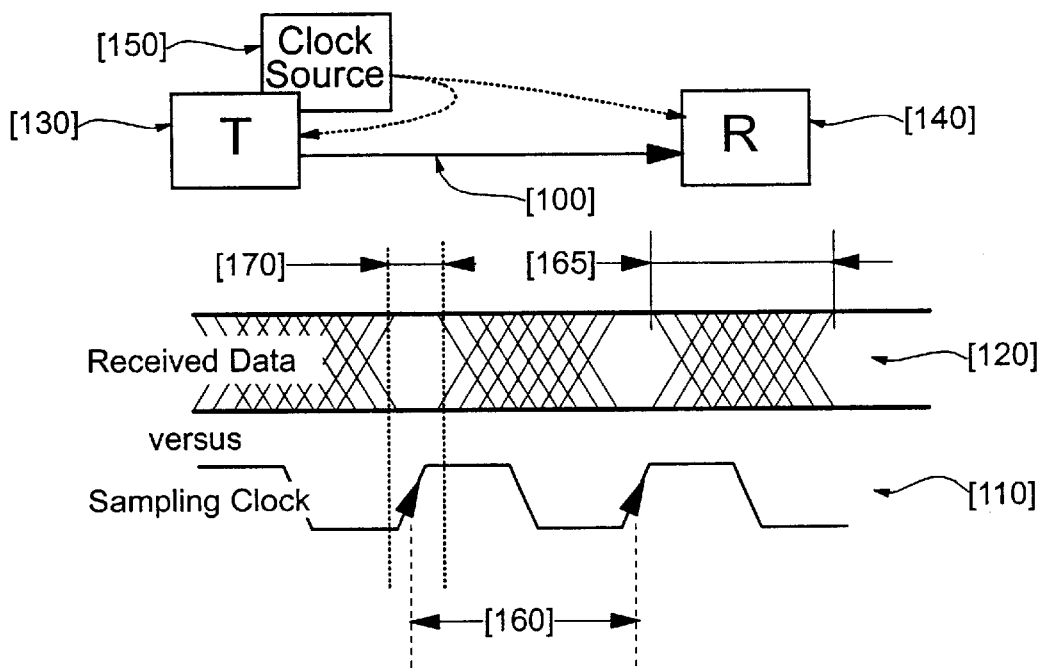
FIG. 1 illustrates and supports the discussion of the prior art.
Figure 2:
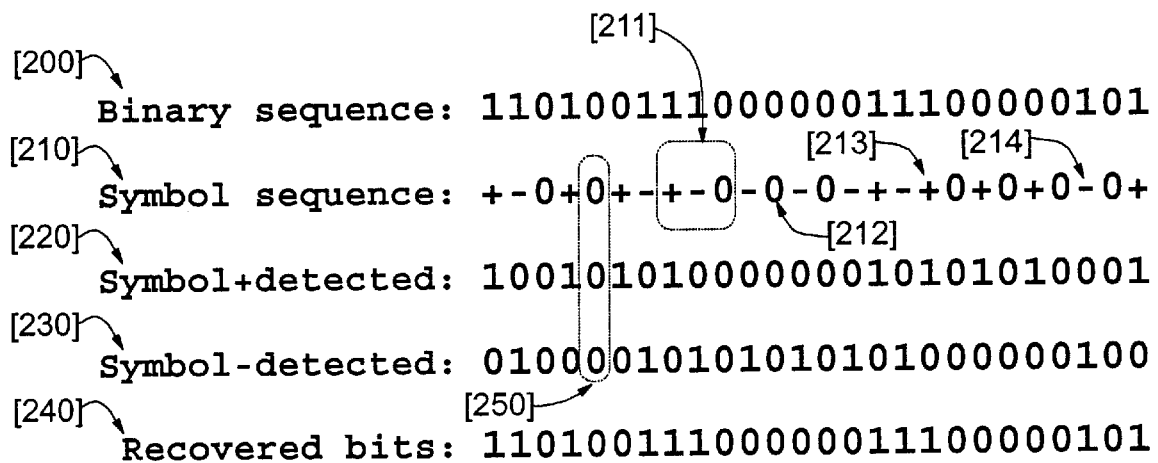
FIG. 2 depicts, through an example, the encoding of a binary sequence into a sequence of symbols according to a preferred embodiment of the present invention.
Figure 3:
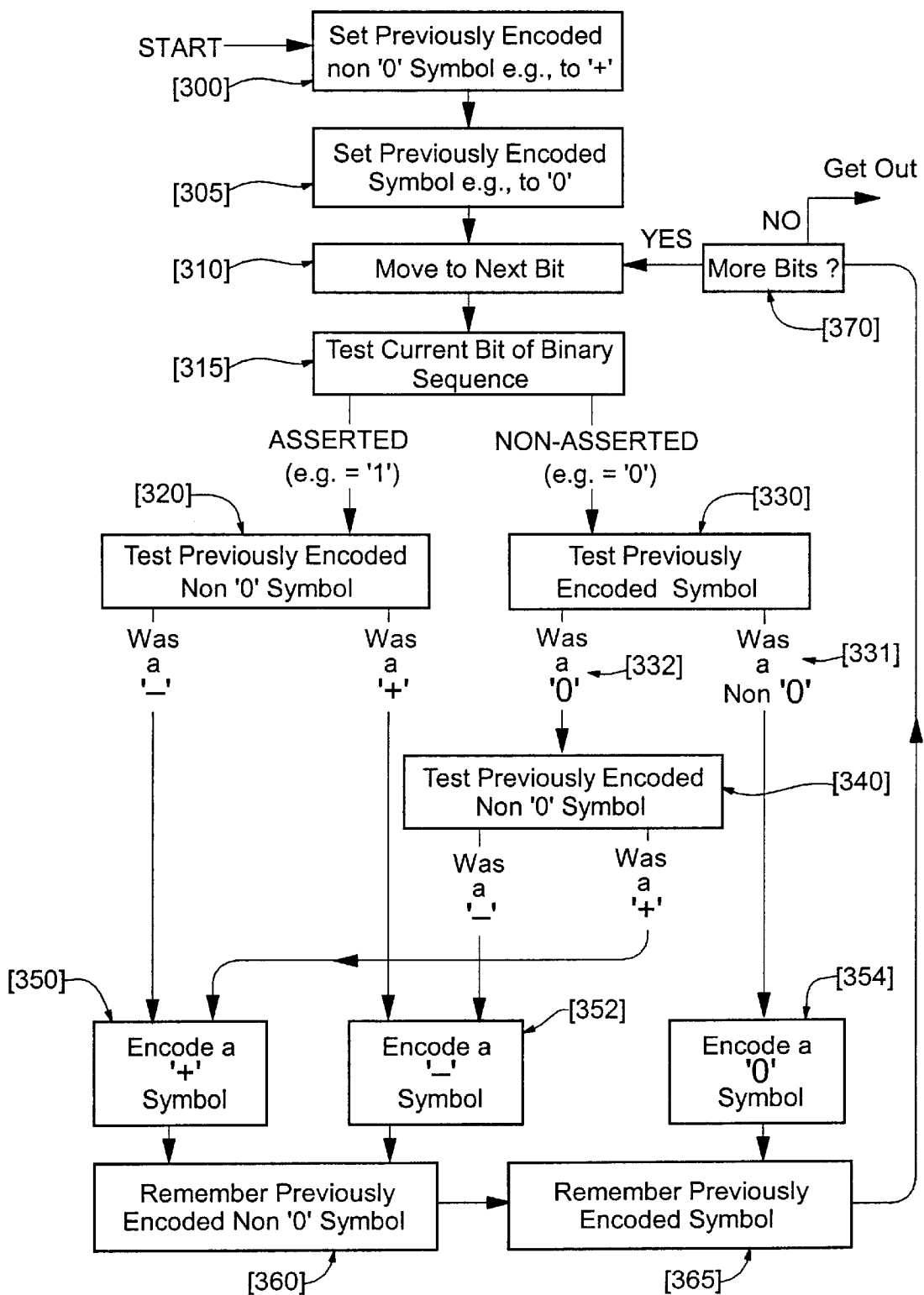
FIG. 3 illustrates the steps of an encoding method according to a preferred embodiment of the present invention.

FIG. 2 depicts, through an example, a bit encoding method according to a preferred embodiment of the present invention. Assuming that binary sequence 200 is to be transmitted, it is encoded by the transmitting side into a ternary sequence of symbols 210 noted: '+', '−' and '0'. Encoding, further discussed in FIG. 3, is such that the ternary sequence of symbols 210 obtained has no two consecutive identical symbols. For two consecutive symbols transmitted, there is always a change of symbols, which permits the restoration of a local sampling clock and also delineates unambiguously successive symbols. Therefore, the following six consecutive two symbol combinations can be found in ternary sequence of symbols 210 namely: '+ −', '+ 0', '− +', '− 0', '0 +', '0 −'. The following sequences are excluded: '+ +', '− −' and '0 0'. Then, the receiving side must decode the received sequence of symbols. Positive symbols '+' and negative symbols '−' are decoded separately under the form of two binary vectors 220 and 230 from which '0' symbols are assumed (i.e., at positions where is neither a positive nor a negative symbol e.g., 250) allowing the system to simply restore a transmitted bit sequence 240. The decoding method is further discussed in FIG. 4.

FIG. 3 illustrates the diagram of an encoding method, according to a preferred embodiment of the invention, applied by the transmitting device to the binary sequences to be sent. It is assumed that "Previous Encoded Non '0' Symbol" (step 360) and "Previous Encoded Symbol" (step 365) must be stored in a memory system. Thus, at the beginning of a binary sequence, these two values can be arbitrarily set (e.g., they are set respectively to the '+' symbol in step 300 for the former and to the '0' symbol for the latter even though other combinations are obviously possible). Then, the process continues with the next bit in step 310, which becomes the current bit. The current bit is tested in step 315 to determine if it is an asserted ('1') or a non-asserted ('0') bit in an active high circuit.

It should be readily apparent to those skilled in the art that the opposite is possible if the circuit is active low. If the current bit is asserted, the process continues to step 320 where "Previous Encoded Non '0' Symbol" is tested. If the previous encoded non '0' symbol was a '−' symbol, then the symbol used to encode must be a '+' symbol (step 350). Conversely, if the previous encoded non; '0' symbol was a '+' symbol then next symbol used must be a '−' symbol in step 352.

However, if the current bit is not asserted, the "Previous Encoded Symbol" must be first tested in step 330. If the previous encoded symbol was not already a '0' symbol (step 331) then, a '0' symbol is used to encode in step 354. If the previous encoded symbol was a '0' symbol (step 332) "Previous Encoded Non '0' Symbol" is further tested in step 340 in which case the decision about the next symbol to be used to encode is opposite to the previous case (step 320). That is, if the previously encoded Non '0' symbol was a '−' symbol, then the next encoded symbol must also be a '−' symbol again in step 352. Similarly, if it was a '+' symbol, then next symbol to encode must be also a '+' symbol (step 350). After which, as already mentioned, the previous encoded non '0' bit (step 360) and previous encoded symbol (step 365) must be both stored in a memory system so as the process may resume with next bit, in step 310. Although the process generally assumes there is always something to transmit, the loop just described is an endless loop while device implementing it is running. If finite sequences of bit have to be encoded, step 370 allows the process to end when a sequence is finished.

Figure 4:
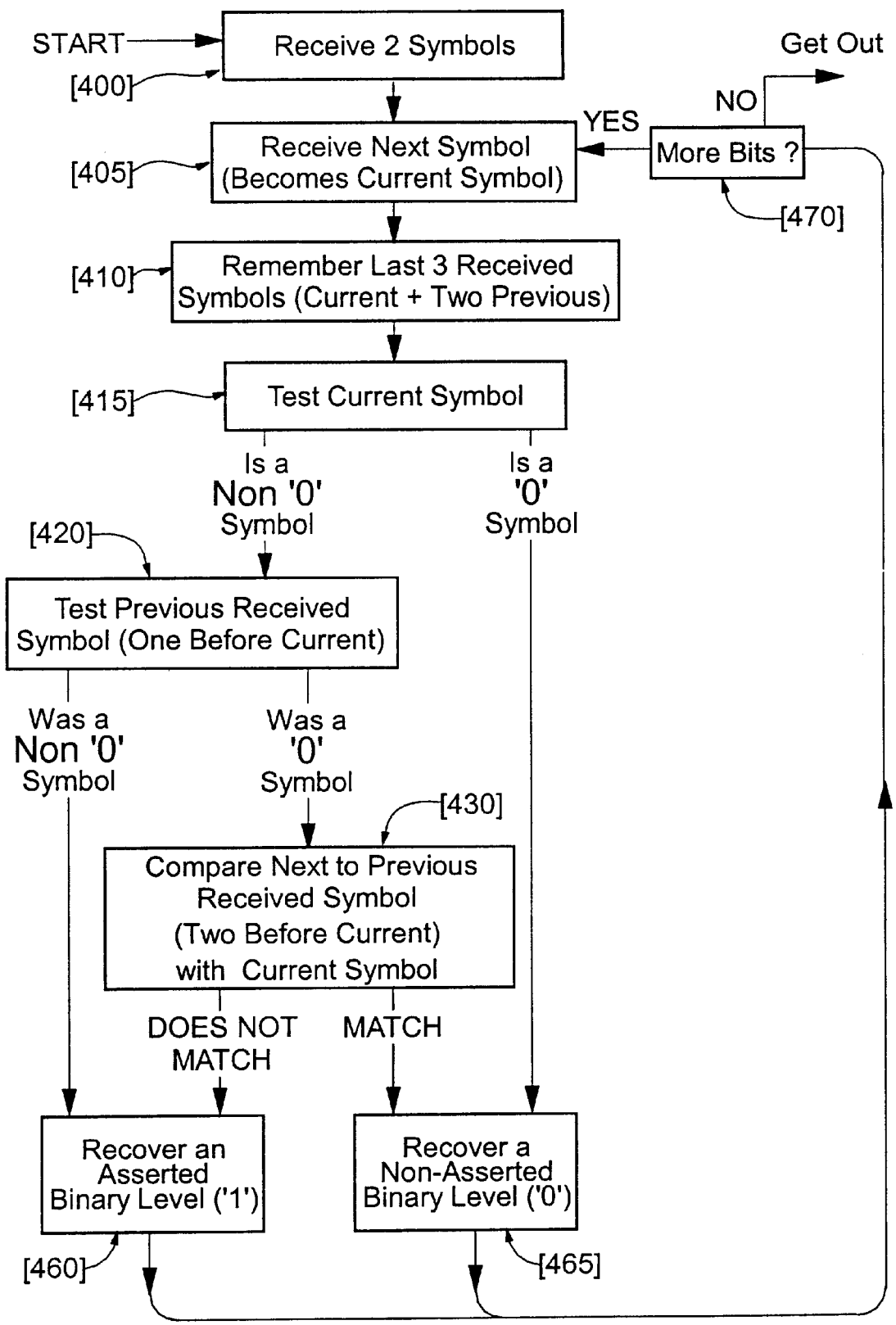
FIG. 4 depicts the steps of a decoding method according to a preferred embodiment of the present invention.

FIG. 4 depicts a diagram of a decoding method to be applied to the received symbol sequences by the receiving device in accordance with a preferred embodiment of the present invention. Three consecutive received symbols must be stored in step 410. In the beginning of the decoding sequence, two symbols must be received first in step 405. Then, upon receiving a next symbol (which becomes the current symbol), in step 410, decoding begins. Thus, the current symbol is tested in step 415 to determine if the current symbol is a '0' symbol. If not, the process continues directly to step 465 where a non-asserted binary level (generally noted as '0') is recovered from the received sequence of symbols. However, if the current symbol was not a '0' then, the previously received symbol (the one received before the current symbol) is further tested in step 420. If the previously received symbol is a non '0' symbol, then one may recover an asserted binary level in step 460 (generally noted as '1'). On the contrary if the previously received symbol is a '0' symbol, the next-to-last (two before current) symbol must also be compared with current symbol in step 430. If the next-to-last symbol and the current symbol match, a non-asserted binary level must be recovered in step 465. If the next-to-last symbol and the current symbol do not match, an asserted binary level is recovered instead. The process resumes at step 405 if an endless sequence of symbols is received. If not, a test is conducted at each loop (step 470) to determine whether or not the process continues. The first two symbols of the decoded sequence must be disregarded because the symbols were latched, as shown in steps 300 and 305 in FIG. 3, as arbitrary symbols required to begin the encoding method.

Figure 5:
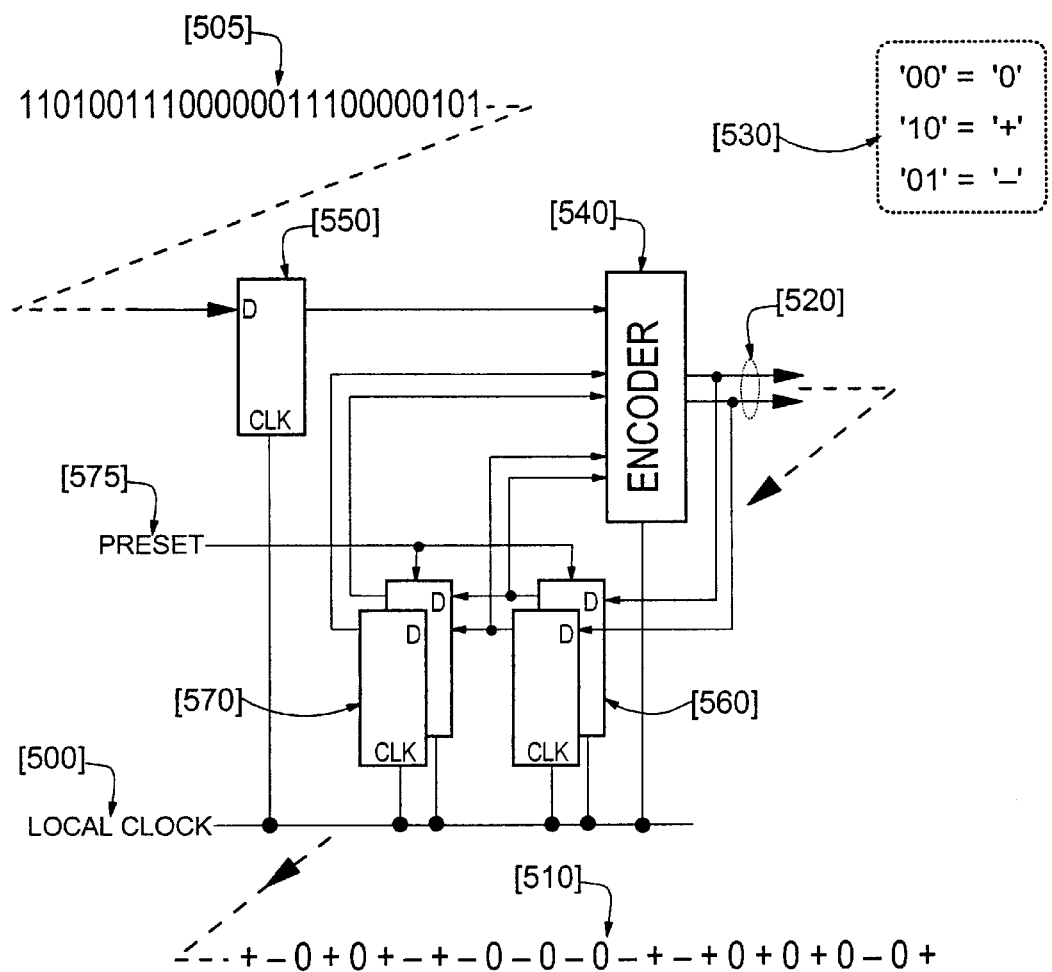
FIG. 5 illustrates an encoder which carries out the encoding of a binary sequence of data bits into a sequence of symbols according to a preferred embodiment of the present invention.

FIG. 5 depicts an encoding system used on the transmitting side, utilizing a local clock 500 according to a preferred embodiment of the present invention. The ternary sequence of symbols 510 to be transmitted, corresponding to binary sequence 505, is assumed to be binary encoded here on two lines 520 according to table 530. The current symbol is computed according to the method of FIG. 3 by encoder 540, using as inputs the current bit of binary sequence 505 temporarily stored in latch 550, plus the last and the next-to-last ternary symbols already computed, which are temporarily stored in latch pairs 560 and 570. Encoder 540 is thus implemented, in this example, using standard Boolean logic blocks and latches according to methods and techniques well known in the art. As discussed in FIG. 3, the two latch pairs 560 and 570 must be preset (step 575) at the beginning of an encoding sequence as if two symbols were already sent. As suggested in FIG. 3, they could be preset to '0' and to '+' so that encoder 540 can begin using '0' as "previously encoded symbol" and '+', found in latch 570, as "previously encoded non '0' symbol". A method of how ternary symbols are actually transmitted is further discussed in FIG. 6.

Figure 6:
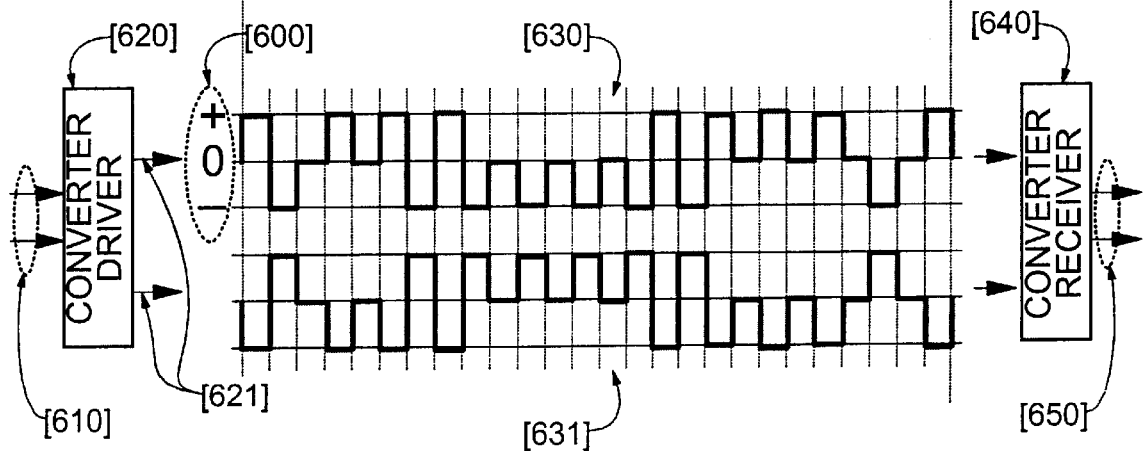
FIG. 6 depicts the transmission and receiving of an example sequence of symbols according to a preferred embodiment of the present invention.

FIG. 6 illustrates a method of transmitting symbols, according to a preferred embodiment of the present invention, based on techniques and means well known in the art. The ternary set of symbols are forwarded under the form of three different electrical voltage levels 600 on a single wire. The binary internally encoded symbols, on lines 610, are transformed in converter driver 620 so that they are transmitted as a '+', a '0' or a '−' voltage 600. However, there is a variable DC component associated with such a signal 630, to prevent the RF (radio frequency) perturbations that would result if an unbalanced signal is transmitted. The severity of the effect depends on the pattern of symbols to be transmitted. A preferred technique, in accordance with a preferred embodiment of the present invention, would include sending the symbols on a differential pair of wires 621 and thus, transmitting signal in true form 630 and complement form 631 so as to remove the DC component and to dramatically reduce the level of generated RF noise. Received symbols are transformed back in converter receiver 640 as a pair of binary signals 650 so they can be processed with standard Boolean logic by the receiving device.

Figure 7:
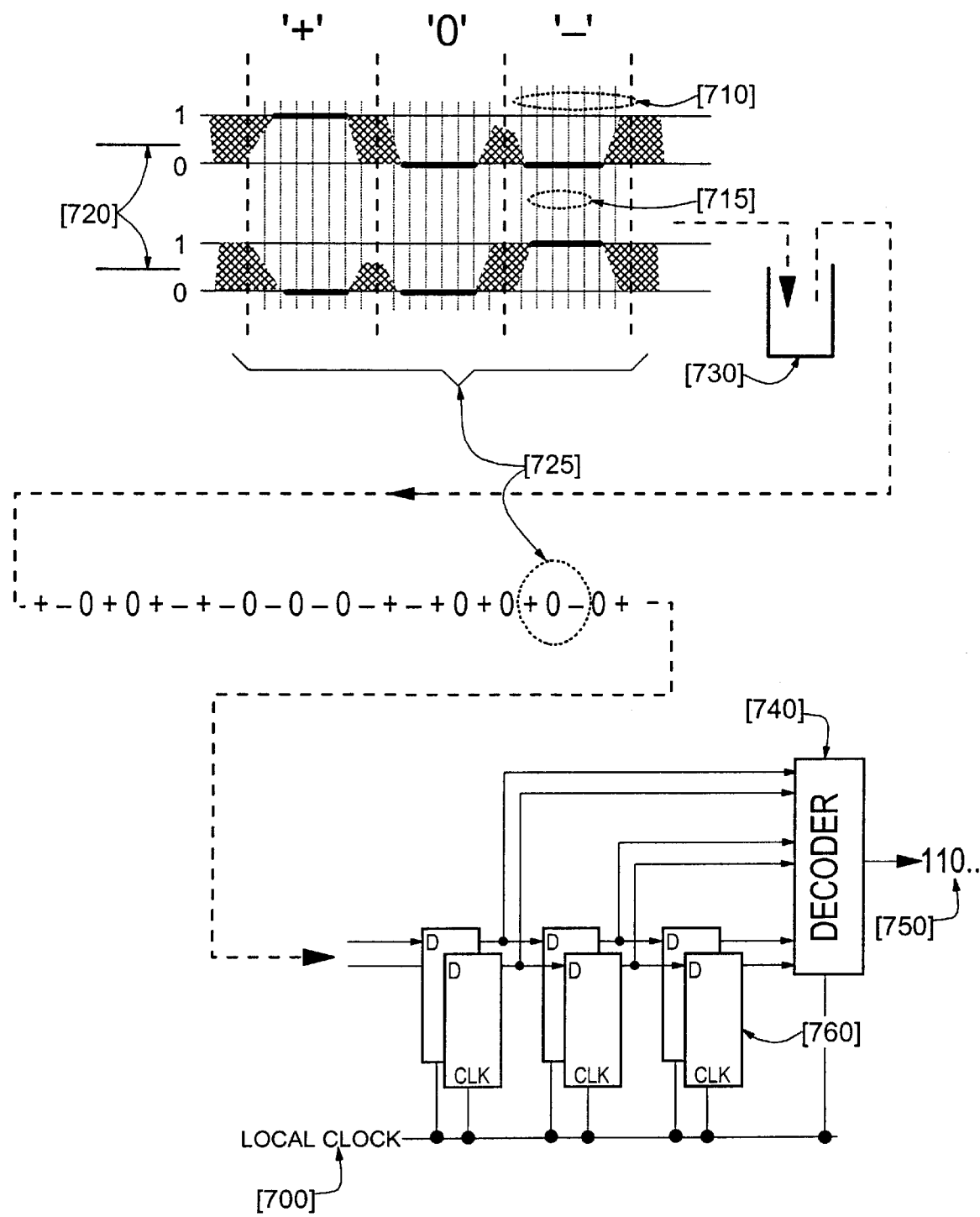
FIG. 7 illustrates a decoder that retrieves the corresponding binary sequence of data bits out of a received sequence symbols according to a preferred embodiment of the present invention.

FIG. 7 depicts a method of recovering the symbols, according to a preferred embodiment of the present invention, by over-sampling the received signal after it has been converted back to binary levels on lines 720 as already discussed. Over-sampling, a technique well known in the art, allows a self-delineation of the succession of unique transmitted symbols by determining the value of a new symbol when its has been stable for a predetermined number of sample periods.

For example, depending on how over-sampling is actually implemented, it may be decided that, out of an average of eight samples periods 710 per received symbol, four successive sample periods must match 715 to decide that a new symbol is indeed received. Many equivalent alternate methods, differing in the over-sampling rate and number of samples that must match, are obviously possible solutions to recovering the symbols. Eventually, a play-out buffer 730 is filled with the received symbols and read-out at the speed of local clock 700. As previously explained, when three symbols have been received and put in latch pairs 760, decoding can be carried out according to a method in a preferred embodiment of the present invention described in FIG. 4. Decoder 740 of this example is assumed to be implemented with standard Boolean logic according to techniques and methods well known in the art. This allows a transmitted binary sequence 750 to be recovered.

Figure 8:
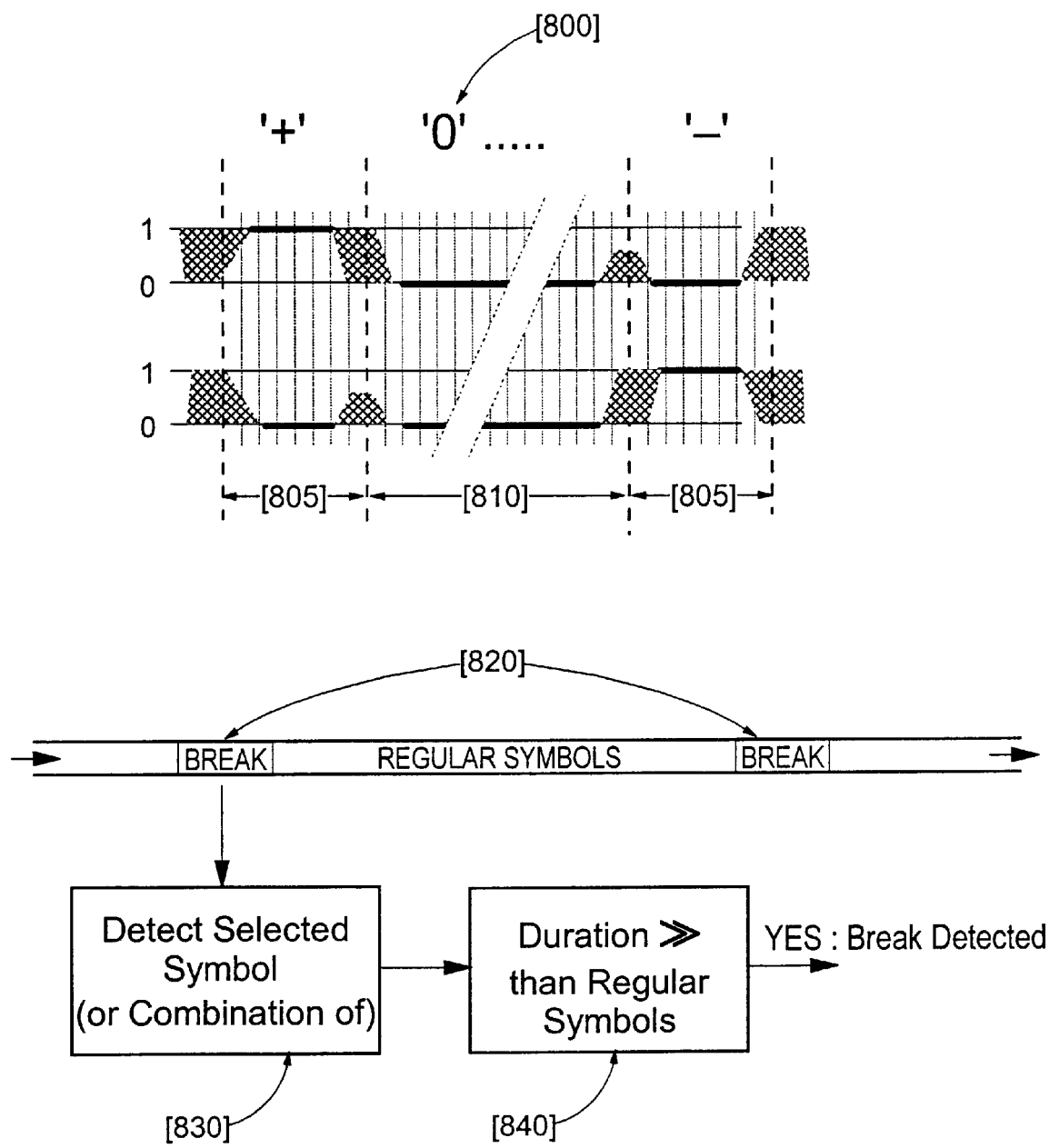
FIG. 8 depicts a method for marking a sequence of symbols with breaks and their detection according to a preferred embodiment of the present invention.

FIG. 8 further elaborates on the transmission of symbols. The sample time 810 of one specific symbol (for example, '0' 800) may be chosen to be made significantly longer than the usual sample time (indicated by 805) so that it marks a break 820 in the sequence of transmitted symbols. One straightforward usage of this is to mark the end and/or beginning of any chunk of transmitted data that should be handled together. In the previous description of the over-sampling of the received signal, this includes setting not only a lower but also an upper bound 840 on the duration or the number of samples that a symbol should normally be comprised. This permits the system to insert and detect (step 830) breaks in the transmission of symbols. Breaks can be of many types, depending on which one of the three symbols is chosen to be repeated and for how long. Obviously, another preferred embodiment of the present invention would combine the two techniques by assuming that break 820 is detected only when two consecutive selected symbols are longer than usual.

What is claimed is:

1. A method of transmitting data over a communication link, said method comprising:

defining a ternary set of symbols including only a null symbol and two non-null symbols, said two non-null symbols comprising a first-value symbol and a second-value symbol;

initializing a pair of latches with values of said ternary set of symbols, wherein said values are not alike;

encoding said binary sequence of said data bits into a sequence of symbols selected from said ternary set of symbols, said sequence of symbols wherein no two consecutive symbols are alike; and transmitting said sequence of symbols in lieu of said binary sequence of data bits.

2. A method of transmitting data over a communication link, said method comprising:

defining a ternary set of symbols including a null symbol and two non-null symbols, said two non-null symbols comprising a first-value symbol and a second-value symbol;

initializing a par of latches with values of said ternary set of symbols, wherein said values are not alike, wherein said initializing step further comprises:

setting a previously encoded non-null symbol latch to a non-null symbol having a value of either said first-value symbol or said second-value symbol; and setting a previously encoded symbol latch to either said null symbol or said non-null symbol distinct from said non-null symbol set in said previously encoded non-null symbol latch;

encoding said binary sequence of said data bits into a sequence of symbols selected from said ternary set of symbols, wherein no two consecutive symbols within said sequence are alike; and transmitting said sequence of symbols in lieu of said binary sequence of data bits.

3. The method according to claim 2, wherein said encoding step further comprises:

testing a current bit of said binary sequence;

in response to an asserted current bit of said binary sequence, testing said previously encoded non-null symbol latch;

in response to said previously encoded non-null symbol latch having the value of said second-value symbol, encoding said first-value symbol;

in response to said previously encoded non-null symbol latch having the value of said first-value symbol, encoding said second-value symbol;

in response to a non-asserted current bit of said binary sequence, testing said previously encoded symbol latch;

in response to said previously encoded symbol latch having a value other than the value of said null symbol, encoding said null symbol;

in response to said previously encoded symbol latch having the value of said null symbol, further testing said previously encoded non-null symbol latch;

in response to said previously encoded non-null symbol latch having the value of said second-value symbol, encoding said second-value symbol;

in response to said previously encoded non-null symbol latch having the value of said first-value symbol, encoding said first-value symbol;

storing said encoded symbol in said previously encoded symbol latch;

in response to encoding a non-null symbol, storing said encoded symbol in said previously encoded non-null symbol latch;

checking if more bits are to be encoded;

in response to having more said bits to be encoded, designating next bit as said current bit; and resuming at testing current bit step.

4. The method according to claim 3, further comprising:
selecting a combination of one or more symbols out of said ternary set of symbols;
making a duration of said combination of one or more symbols significantly longer than that of regular symbols; and
inserting said combination of one or more symbols as breaks in said sequence of symbols.

5. The system according to claim 1, said system further comprising:
a means for detecting breaks in said sequence of symbols including:
means for detecting said selected combination of one or more symbols out of said sequence of symbols;
means for checking for duration of said selected combination; and
means for recognizing a break if said duration is significantly longer than the duration of regular symbols.

6. A system for transmitting data over a communication link, said system comprising:
means for defining a ternary set of symbols including only a null symbol and two non-null symbols said two non-null symbols comprising a first-value symbol and a second-value symbol;
means for initializing a pair of latches with values of said ternary set of symbols, wherein said values are not alike;
means for encoding said binary sequence of said data bits into a sequence of symbols selected from said ternary set of symbols, said sequence of symbols wherein no two consecutive symbols are alike; and
means for transmitting said sequence of symbols in lieu of said binary sequence of data bits.

7. A system for transmitting data over a communication link, said system comprising:
means for defining a ternary set of symbols including a null symbol and two non-null symbols said two non-null symbols comprising a first-value symbol and a second-value symbol;
means for initializing a pair of latches with values of said ternary set of symbols, wherein said values are not alike, wherein said initialization means further comprises:
means for setting a previously encoded non-null symbol latch to a non-null symbol having a value of either said first-value symbol or said second-value symbol; and
means for setting a previously encoded symbol latch to either said null symbol or said non-null symbol distinct from said non-null symbol set in said previously encoded non-null symbol latch;
means for encoding said binary sequence of said data bits into a sequence of symbols selected from said ternary set of symbols, said sequence of symbols wherein no two consecutive symbols are alike; and
means for transmitting said sequence of symbols in lieu of said binary sequence of data bits.

8. The system according to claim 7, wherein said encoding means further comprises:
means for testing a current bit of said binary sequence;
means, in response to an asserted current bit of said binary sequence, for testing said previously encoded non-null symbol latch;
means, in response to said previously encoded non-null symbol latch having the value of said second-value symbol, for encoding said first-value symbol;
means, in response to said previously encoded non-null symbol having the value of said first-value symbol, for encoding said second-value symbol;
means, in response to a non-asserted current bit of said binary sequence, for testing said previously encoded symbol latch;
means, in response to said previously encoded symbol latch having a value other than the value of said null symbol, for encoding said null symbol;
means, in response to said previously encoded symbol latch having the value of said null symbol, for further testing said previously encoded non-null symbol;
means, in response to said previously encoded non-null symbol latch having the value of said second-value symbol, for encoding said second-value symbol;
means, in response to said previously encoded non-null symbol latch having the value of said first-value symbol, for encoding said first-value symbol;
means for storing said encoded symbol in said previously encoded symbol latch;
means, in response to encoding a non-null symbol, for storing said encoded symbol in said previously encoded non-null symbol latch;
means for checking if more bits are to be encoded;
means, in response to having more said bits to be encoded, for designating next bit as said current bit; and
means, in response to not having more said bits to be encoded, for ending the process.

9. The system of claim 6, wherein said encoding means further comprises a means for encoding a ternary set of symbols over a pair of binary signals carried out with binary Boolean logic.

10. A method of decoding a sequence of symbols comprising:
receiving two symbols;
further receiving a next symbol, said next symbol becoming a current symbol;
storing last three received symbols;
testing said current symbol;
in response to said current symbol having the value of a null symbol, recovering a non-asserted binary level;
in response to said current symbol having the value of a non-null symbol, testing a previously received symbol;
in response to said previously received symbol having the value of the other non-null symbol, recovering an asserted binary level;
in response to said previously received symbol having the value of said null symbol, comparing said current symbol with a next-to-previously received symbol;
in response to the values of said previously received symbol and said next-to-previously received symbols matching, recovering said non-asserted binary level;
in response to the values of said previously received symbol and said next-to-previously received symbols not matching, recovering said asserted binary level;
checking if more symbols are to be decoded;
in response to having more said symbols to be decoded, receiving said next symbol, said next symbol becoming said current symbol, and resuming with the testing said current symbol step; and
in response to not having more said symbols to be decoded, ending the process.

11. The method according to claim 10, further including:
detecting a selected combination of one or more symbols out of said sequence of symbols;
checking for a duration of said selected combination; and
detecting a break if said duration is significantly longer than a duration of regular symbols.

12. A system for decoding a sequence of symbols, comprising:
means for receiving two symbols;
means for further receiving a next symbol said next symbol becoming a current symbol;
means for storing last three received symbols;
means for testing said current symbol;
means, in response to said current symbol having the value of a null symbol, for recovering a non-asserted binary level;
means, in response to said current symbol having the value of a non-null symbol, for testing a previously received symbol;
means, in response to said previously received symbol having the value of the other non-null symbol, for recovering an asserted binary level;
means, in response to said previously received symbol having the value of said null symbol, for comparing said current symbol with a next-to-previously received symbol;
means, in response to the values of said previously received symbol and said next-to-previously received symbols matching, for recovering a non-asserted binary level;
means, in response to the values of said previously received symbol and said next-to-previously received symbols not matching, for recovering said asserted binary level;
means for checking if more symbols are to be decoded;
means, in response to having more said symbols to be decoded, for receiving said next symbol, said next symbol becoming said current symbol;
means for returning control to said means for testing said current symbol; and
means, in response to not having more said symbols to be decoded, for ending the process.

13. A system according to claim 12, wherein said system includes a converter driver, further comprising:
means for converting ternary set of symbols into electrical levels.

14. A system according to claim 12, wherein said system includes a converter receiver, further comprising:
means for converting said electrical levels back into symbols out of said ternary set of symbols.

15. A method of sending and receiving a binary sequence of data bits over a communication link, said method comprising:
an encoding step comprising:
testing a current bit of said binary sequence;
in response to an asserted current bit of said binary sequence, testing said previously encoded non-null symbol latch;
in response to said previously encoded non-null symbol latch having the value of said second-value symbol, encoding said first-value symbol;
in response to said previously encoded non-null symbol latch having the value of said first-value symbol, encoding said second-value symbol;
in response to a non-asserted current bit of said binary sequence, testing said previously encoded symbol latch;
in response to said previously encoded symbol latch having a value other than the value of said null symbol, encoding said null symbol;
in response to said previously encoded symbol latch having the value of said null symbol, further testing said previously encoded non-null symbol latch;
in response to said previously encoded non-null symbol latch having the value of said second-value symbol, encoding said second-value symbol;
in response to said previously encoded non-null symbol latch having the value of said first-value symbol, encoding said first-value symbol;
storing said encoded symbol in said previously encoded symbol latch;
in response to encoding a non-null symbol, storing said encoded symbol in said previously encoded non-null symbol latch;
checking if more bits are to be encoded;
in response to having more said bits to be encoded, designating next bit as said current bit; and
resuming at testing current bit step; and
a transmitting step comprising:
transmitting a sequence of said encoded symbols in true form and complement form; and
a decoding step comprising:
receiving two symbols;
further receiving a next symbol said next symbol becoming a current symbol;
storing last three received symbols;
testing said current symbol;
in response to said current symbol having the value of a null symbol, recovering a non-asserted binary level;
in response to said current symbol having the value of a non-null symbol, testing a previously received symbol;
in response to said previously received symbol having the value of the other non-null symbol, recovering an asserted binary level;
in response to said previously received symbol having the value of said null symbol, comparing said current symbol with a next-to-previously received symbol;
in response to the values of said previously received symbol and said next-to-previously received symbols matching, recovering said non-asserted binary level;
in response to the values of said previously received symbol and said next-to-previously received symbols not matching, recovering said asserted binary level;
checking if more symbols are to be decoded;
in response to having more said symbols to be decoded, receiving said next symbol, said next symbol becoming said current symbol and resuming with the testing said current symbol step; and
in response to not having more said symbols to be decoded, ending said decoding step.

16. The method according to claim 15, said method further including:
selecting a combination of one or more symbols from among said null symbol, said first-value symbol and said second-value symbol;
making a duration of said combination of one or more symbols significantly longer than that of regular symbols; and inserting said combination of one or more symbols as breaks in said sequence of symbols.

17. The method of claim 16, said method further comprising:

detecting said selected combination of one or more symbols out of said sequence of symbols;

checking for said duration of said selected combination; and detecting a said break if said duration is significantly longer than a duration of regular symbols.

18. A system for sending a binary sequence of data bits encoded as a sequence of symbols, the system comprising:

an encoder for encoding binary data bits into a said sequence of symbols; and means, coupled to said encoder, for transmitting each symbol within said sequence of symbols in both true form and complement form.

19. The system according to claim 18, wherein said means for transmitting is a differential pair of wires.

20. A system for sending a binary sequence of data bits encoded as a sequence of symbols, the system comprising:

an encoder for encoding binary data bits into a sequence of symbols;

means, coupled to said encoder, for transmitting each symbol within said sequence of symbols in both true form and complement form;

means for inserting breaks into said sequence of symbols including:

means for selecting a combination of one or more symbols out of a ternary set of symbols;

means for making a duration of said combination of one or more symbols significantly longer than regular symbols; and means for inserting said combination of one or more symbols as breaks in said sequence of symbols.

* * * * *